(12) United States Patent
Chen et al.

(10) Patent No.: US 8,742,441 B2
(45) Date of Patent: Jun. 3, 2014

(54) LIGHT-EMITTING DIODE WITH EMBEDDED ELEMENTS

(75) Inventors: Ding-Yuan Chen, Taichung (TW); Wen-Chih Chiou, Miaoli (TW); Chen-Hua Yu, Hsin-Chu (TW)

(73) Assignee: TSMC Solid State Lighting Ltd., HsinChu (TW)

(*) Notice: Subject to any disclaimer, the term of this patent is extended or adjusted under 35 U.S.C. 154(b) by 162 days.

(21) Appl. No.: 12/547,428

(22) Filed: Aug. 25, 2009

(65) Prior Publication Data
US 2010/0059779 A1 Mar. 11, 2010

Related U.S. Application Data

(60) Provisional application No. 61/095,852, filed on Sep. 10, 2008.

(51) Int. Cl.
*H01L 29/72* (2006.01)
(52) U.S. Cl.
USPC ..................... 257/98; 257/E33.001
(58) Field of Classification Search
USPC .......................................................... 257/98
See application file for complete search history.

(56) References Cited

U.S. PATENT DOCUMENTS

| | | | |
|---|---|---|---|
| 6,410,940 B1 | 6/2002 | Jiang et al. | |
| 2005/0194598 A1 | 9/2005 | Kim et al. | |
| 2008/0246046 A1* | 10/2008 | Chik et al. | 257/98 |
| 2009/0026476 A1* | 1/2009 | Tazima et al. | 257/98 |
| 2009/0212312 A1* | 8/2009 | Tsai et al. | 257/98 |
| 2011/0089456 A1* | 4/2011 | Andrews et al. | 257/98 |

OTHER PUBLICATIONS

Fujii, T., et al., "Increase in the extraction efficiency GaN-based light-emitting diodes via surface roughening," Applied Physics Letters, vol. 84, No. 6, Feb. 9, 2004, pp. 855-857.
Huang, H-W., et al., "Investigation of InGaN/GaN light emitting diodes with nano-roughened surface by excimer laser etching method," Materials Science and Engineering B 136, 2007, pp. 182-186.

* cited by examiner

*Primary Examiner* — Edward Wojciechowicz
(74) *Attorney, Agent, or Firm* — Haynes and Boone, LLP

(57) ABSTRACT

A light-emitting diode (LED) device is provided. The LED device has a substrate and an LED structure overlying the substrate. Embedded elements are embedded within one or more layers of the LED structure. In an embodiment, the embedded elements include a dielectric material extending through the LED structure such that the embedded elements are surrounded by the LED structure. In another embodiment, the embedded elements only extend through an upper layer of the LED structure, or alternatively, partially through the upper layer of the LED structure. Another conductive layer may be formed over the upper layer of the LED structure and the embedded elements.

20 Claims, 14 Drawing Sheets

LIGHT-EMITTING DIODE WITH EMBEDDED ELEMENTS

This application claims the benefit of U.S. Provisional Application Ser. No. 61/095,852, filed on Sep. 10, 2008, entitled "Light-Emitting Diode with Embedded Elements," which application is hereby incorporated herein by reference.

TECHNICAL FIELD

This invention relates generally to semiconductor devices and, more particularly, to crystalline group III-V light-emitting diodes.

BACKGROUND

Generally, a light-emitting diode (LED) is generally formed of a first conductive layer having a first conductivity type, an active layer, and a second conductive layer having a second conductivity type, thereby forming a diode that will generate light when it is forward-biased. Different colors of LEDs may be created by using materials with different band gaps. The active layer typically emits light from both sides of the light-emitting layer and is propagated in all directions. In practice, however, applications frequently only require light emitted from a single side and along a specific direction, and because light is emitted from both sides and in all directions, some light energy is lost.

In an attempt to increase the amount of light emitted from a single side of the LED device, a reflective layer has been formed between the substrate and the LED structure. The reflective layer comprises a metal reflective material that acts to reflect light emitted from the LED device on the substrate side back towards the light-emitting face of the LED device, thereby increasing the light efficiency of the LED device.

While the reflective metal layer helps to increase the light emitted on a single side of an LED device, the light emitted is still generally propagated outwards in all directions over a 180° range. This propagation of light emitted in all directions is undesirable in some applications that require the light to be emitted along a specific direction, such as to a set of lenses, or the like.

Another attempt at enhancing the light output from an LED device is to roughen the light-emitting surface. An LED device having a smooth surface will exhibit a higher degree of total internal reflection, wherein light is reflected back toward the active layer rather than being emitted. To reduce the total internal reflection, the surface of the LED device may be roughened. The surface roughness is typically controlled by the metal organic chemical vapor deposition process when forming the LED device or by an etch process after the LED device has been formed. While the surface roughening increases the light output, creating a good ohmic contact on the rough surface is difficult.

Yet another method of enhancing light output from an LED device involves the formation of nanorods. In this method, the LED device comprises many nano-scale light-emitting rods that extend vertically upward from a substrate. The light output from a nanorod structure, however, is still reduced by total internal reflection because a large fraction of the light produced by the nanorods is incident on the nanorod sidewalls at an angle larger than the critical angle.

As a result, there is a need for an LED device having an increased light efficiency.

SUMMARY OF THE INVENTION

These and other problems are generally reduced, solved or circumvented, and technical advantages are generally achieved, by embodiments of the present invention, which provides light-emitting diodes (LEDs) having light-extraction embedded elements.

In accordance with one aspect of the present invention, an LED device is provided. The LED device includes a substrate having an LED structure formed thereon. The LED structure has a lower LED layer, an active layer, and a first upper LED layer. Embedded elements extend at least partially through the first upper LED layer of the LED structure and, from a plan view, are surrounded by the LED structure. The embedded elements are formed of a material having a different refractive index than the first upper LED layer. The embedded elements may extend completely through the LED structure, only through the first upper LED layer, or only partially through the first upper LED layer. An optional second upper LED layer may be formed over the first upper LED layer and the embedded elements.

In accordance with another aspect of the present invention, an LED device is provided. The LED device includes a substrate and an LED structure over the substrate. The LED structure has embedded elements within at least a first conductive layer. The embedded elements have a refractive index different than the layer of the LED structure in which the embedded elements are embedded. The embedded elements may extend completely through the LED structure, only through a first upper LED layer, or only partially through the first upper LED layer. An optional second upper LED layer may be formed over the first upper LED layer and the embedded elements.

In accordance with yet another aspect of the present invention, a method of forming an LED device is provided. The method includes providing a substrate, forming an LED structure on the substrate, and forming a plurality of embedded elements in the LED structure such that the embedded elements are surrounded by the LED structure. The embedded elements have a different refractive index than the LED structure. The embedded elements may extend completely through the LED structure, only through an upper LED layer, or only partially through the upper LED layer. An optional conductive layer may be formed over the LED structure and the embedded elements.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
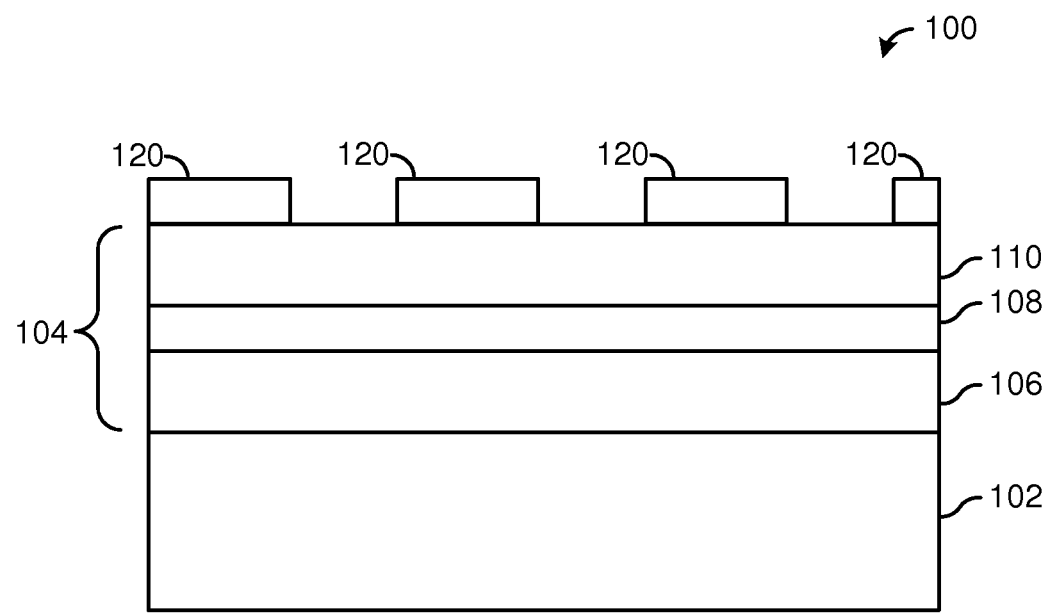
FIGS. 1-4 illustrate various process steps for manufacturing a light-emitting diode device in accordance with an embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Novel methods for forming light-emitting diodes (LEDs) are provided. It should be understood that steps necessary to illustrate the inventive aspects of the invention are shown, but other processes known in the art may be performed in conjunction with the illustrative steps. Throughout the various views and illustrative embodiments of the present invention, like reference numerals are used to designate like elements.

FIGS. 1-4 illustrate various process steps of forming an LED device 100 with embedded elements in accordance with an embodiment of the present invention. Referring first to FIG. 1, the LED device 100 is shown having a substrate 102 and an LED structure 104 formed thereon. The substrate 102 can be any of the substrates on which LED devices are fabricated, including sapphire substrates, SiC substrates, silicon substrates, and the like. For crystalline substrates different surface orientations such as (111), (110), or (100) may be used.

The LED structure 104 may comprise any LED structure suitable for a particular application. Generally, the LED structure 104 includes a lower LED layer 106 formed over the surface of the substrate 102. Preferably, the lower LED layer 106 is formed of a group III-V compound doped with a dopant of a first conductivity type. For example, a group III-V compound having an n-type conductivity such as n-GaN may be used. The lower LED layer 106 of n-GaN may be formed by, for example, a metal organic vapor phase epitaxy (MOVPE) process by placing the substrate in the reaction chamber of a metal organic plasma vapor epitaxy (MOPVE) apparatus heated to about 1,000° C., wherein hydrogen, ammonia, and trimethyl gallium (TMGa) are supplied in the reaction chamber. In order to form n-type doped GaN, silane ($SiH_4$) is also introduced into the reaction chamber. A pressure in the reaction chamber of about 40 torr may be used. Other processes, such as molecular-beam epitaxy (MBE), metal organic chemical vapor deposition (MOCVD), hydride vapor phase epitaxy (HVPE), liquid phase epitaxy (LPE), or the like, may also be used, and other group III-N materials that may be used include, for example, GaN, InN, AlN, $In_xGa_{(1-x)}N$, $Al_xGa_{(1-x)}N$, $Al_xIn_yGa_{(1-x-y)}N$, or the like. Other group III-V materials may also be used.

A light-emitting layer 108 (also sometimes referred to as an active layer) is formed on the lower LED layer 106. The light-emitting layer 108 may include a homojunction, heterojunction, single-quantum well (SQW), multiple-quantum well (MQW), or the like, structure. In an exemplary embodiment, the light-emitting layer 108 comprises undoped n-type gallium indium nitride ($Ga_xIn_yN_{(1-x-y)}$). In alternative embodiments, the light-emitting layer 108 includes other commonly used materials such as $Al_xIn_yGa_{(1-x-y)}N$. In yet other embodiments, the light-emitting layer 108 may be a multiple quantum well including multiple well layers (such as InGaN) and barrier layers (such as GaN) allocated in an alternating pattern. Again, the formation methods include MOVPE, MOCVD, MBE, HVPE, LPE, or other applicable CVD methods.

A first upper LED layer 110 is disposed on the light-emitting layer 108. The first upper LED layer 110 is preferably formed of a group III-N compound doped with a dopant of a second conductivity type, opposite of the first conductivity type, such as p-GaN, and may be formed by a process similar to the lower LED layer 106. For example, in an embodiment in which an n-GaN/MQW/p-GaN LED structure is utilized, the first upper LED layer 110 may be a p-GaN layer formed by an MOVPE process that takes place in a reaction chamber heated to about 1,000° C., wherein hydrogen, ammonia, and trimethyl gallium (TMGa) are supplied to the reaction chamber. In order to form p-type doped GaN, bis-cyclopentadienylmagnesium ($CP_2Mg$) is also introduced into the reaction chamber. A pressure in the reaction chamber of about 40 ton may be used.

It should be noted that the above description provides a general overview of the construction of an LED structure for illustrative purposes. Other layers, such as reflective layers (e.g., distributed Bragg reflectors, omni-directional reflectors), buffer/nucleation layers, cladding/contact layers, or the like, may also be present as required and/or desired for a particular application. Furthermore, it should be noted that where a layer was described as a single layer, a plurality of layers may be used comprising the same or different materials. For example, the lower and first upper LED layers may each comprise one or more contact layers and one or more cladding layers, which may both be formed of the same or different materials. The structure of the LED structure may also vary depending on the type of materials used and the intended application. It is expected that the many types of LED structures may be used with embodiments of the present invention, which provides embedded structures within the LED structure 104.

It should also be noted that the above process assumes a p-up LED structure. In this embodiment, the lower LED layer 106 is doped to an n-type conductivity, and the first upper LED layer 110 is doped to a p-type conductivity. In other embodiments of the present invention in which an n-up LED structure is utilized, the lower LED layer 106 and/or the substrate 102 are doped to have a p-type conductivity, and the first upper LED layer 110 is doped to have an n-type conductivity.

Also shown in FIG. 1 is a patterned mask 120 comprising one or more dielectric layers. In an embodiment, the patterned mask 120 comprises a silicon dioxide layer formed by, for example, thermal oxidation or by CVD techniques using tetra-ethyl-ortho-silicate (TEOS) and oxygen as a precursor, or a silicon nitride layer formed using CVD techniques using silane and ammonia as precursor gases. Alternatively, the patterned mask 120 may be formed of other dielectric materials. For example, silicon oxynitride, or the like, may also be used. A multi-layer hard mask, such as layers of silicon dioxide and silicon nitride, may also be used. Furthermore, other materials, such as a metal, a metal nitride, a metal oxide, or the like, may be used. For example, the patterned mask 120 may be formed of tungsten.

After a blanket layer of dielectric is formed, the patterned mask 120 may be subsequently patterned using photolithography techniques known in the art. Generally, photolithography techniques involve depositing a photoresist material and irradiating the photoresist material in accordance with a pattern. Thereafter, the photoresist material is developed to remove a portion of the photoresist material. The remaining photoresist material protects the underlying material during subsequent processing steps, such as etching. In this case, the photoresist material is utilized to create the patterned mask 120 by creating a pattern of openings in the photoresist that is subsequently etched into the blanket layer of dielectric to form the patterned mask 120. The resulting openings in the patterned mask 120 expose portions of the LED structure 104 for a subsequent etching process.

Figure 2:
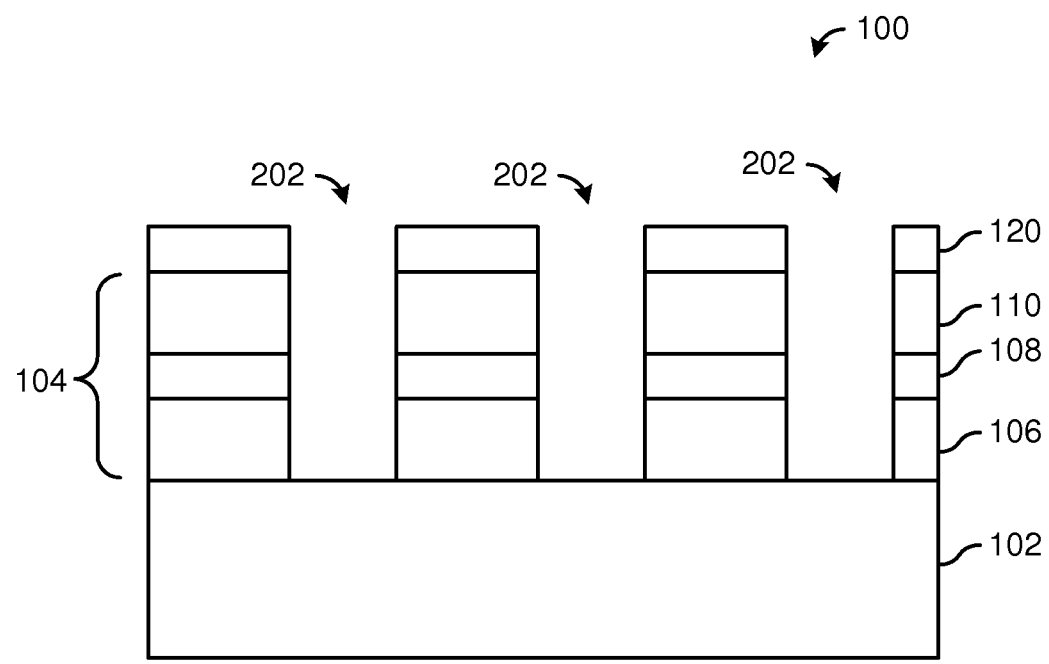

FIG. 2 illustrates the LED device 100 after an etching step has been performed to create openings 202 in accordance with an embodiment of the present invention. During this etching process, the patterned mask 120 protects portions of the underlying LED structure 104 from the etch process. As a result, the unprotected portions of the LED structure 104 are removed, thereby forming the openings 202. In an embodiment, the etching process is performed at least in part by a photo-enhanced electrochemical (PEC) wet etch using KOH. The openings 202 are preferably about 10 nm to about 10 μm wide and extend down to at least the substrate 102. Other etching processes, including dry etch processes (e.g., inductively-coupled plasma (ICP) etching, reactive ion etching (RIE), and the like) and/or wet etch processes (e.g., chemical etching, photo-assisted cryogenic (PAC) etching, and the like) may be used. It should be noted that the openings 202 may be of any shape, such as a pyramid, tapered, cylindrical, semisphere, column, rectangular, or the like, but circular openings 202 are preferred.

Figure 3:
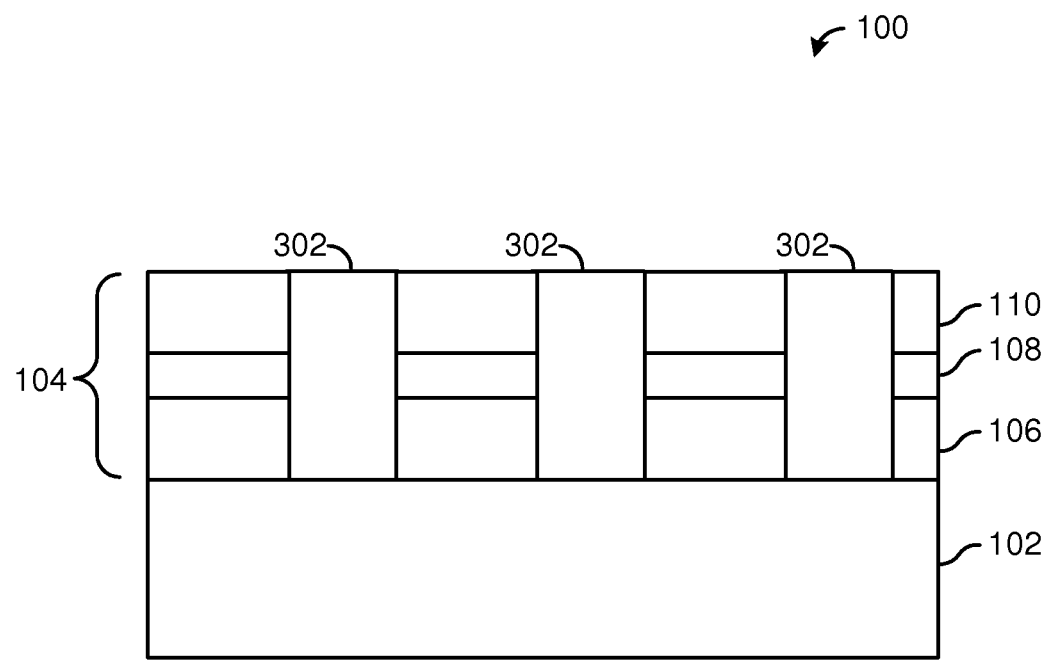

FIG. 3 illustrates the LED device 100 after the openings 202 (see FIG. 2) have been filled to form embedded elements 302 in accordance with an embodiment of the present invention. It should be noted that in this embodiment, the openings 202, and hence the embedded elements 302, contact all layers of the LED structure 104. In this embodiment, it is preferred that a non-conductive or dielectric material be used to fill the openings 202. For example, the embedded elements 302 may be formed of a dielectric material such as silicon dioxide formed by chemical vapor deposition. Other materials, such as spin-on-glass, epoxy resin, or the like, may also be used. Accordingly, the term embedded elements refers to the discrete solid structures formed by filling the openings 202 with a solid material. Therefore the term embedded element does not encompass unfilled openings or interconnected openings (whether filled or unfilled), such as the interconnected spaces surrounding nanorods.

While any suitable material may be used to form the embedded elements 302, it is preferred that the material used have a different refractive index than the LED structure 104. In this manner, the difference in the refractive index causes light emitted from the light-emitting layer 108 of the LED structure 104 to be reflected and/or refracted back towards the general viewing direction.

If necessary, a planarization process may be performed. Depending upon the method used to form the embedded elements 302, it may be desirable to remove overfill material used to form the embedded elements 302 from the surface of the LED structure 104. This may be accomplished by a chemical-mechanical polishing process, an etch-back process, or the like.

The patterned mask 120 may be removed before or after the forming the embedded elements 302. In an embodiment, the patterned mask 120 may be removed by a wet dip in a solution of HF. In another embodiment, the patterned mask 120 is removed during the planarization process.

Figure 4:
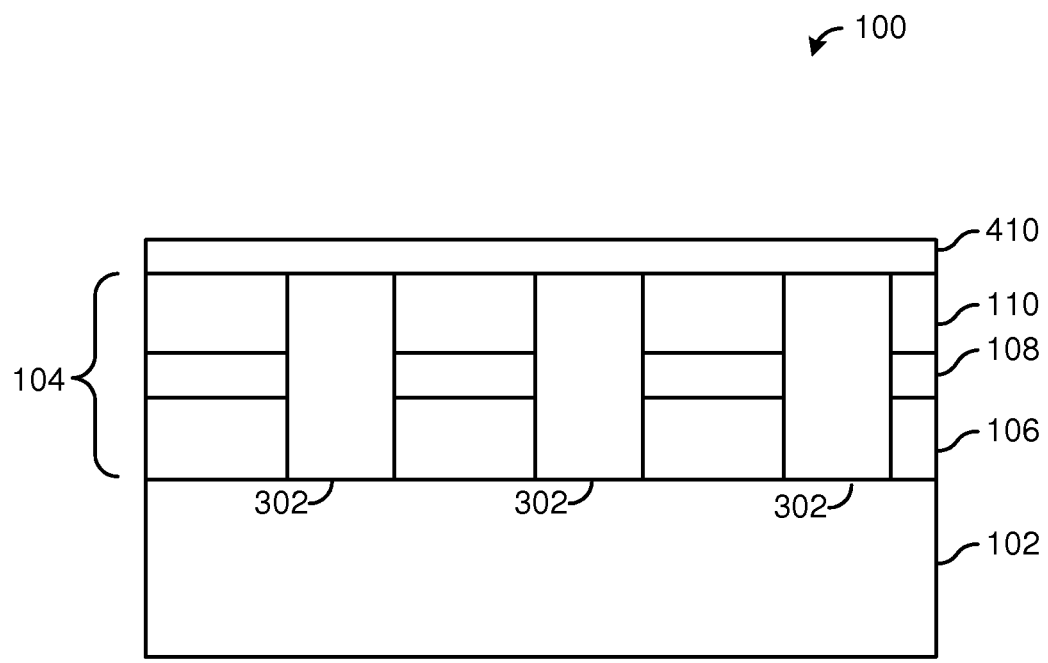

FIG. 4 illustrates an optional second upper LED layer 410 formed over the first upper LED layer 110 formed in accordance with an embodiment of the present invention. The second upper LED layer 410 may be utilized to help planarize the upper LED layer to allow a better ohmic contact to be formed and may be formed using similar processes as those used to form the first upper LED layer 110. Other processes and materials, however, may be used.

Thereafter, processes may be performed to complete the LED device 100. For example, electrical contacts (front-side and/or back-side contacts) may be formed to the first and second contact layers, respectively, passivation layers may be formed, and the LED device may be diced and packaged.

Figure 5:
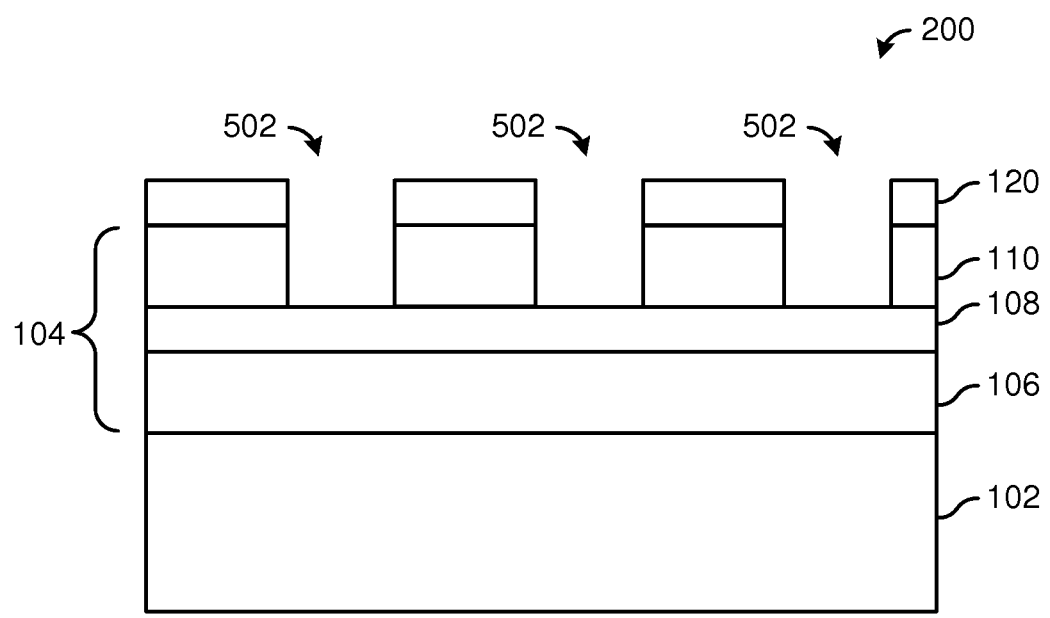
FIGS. 5 and 6 illustrate various process steps for manufacturing a light-emitting diode device in accordance with another embodiment of the present invention.
Figure 6:
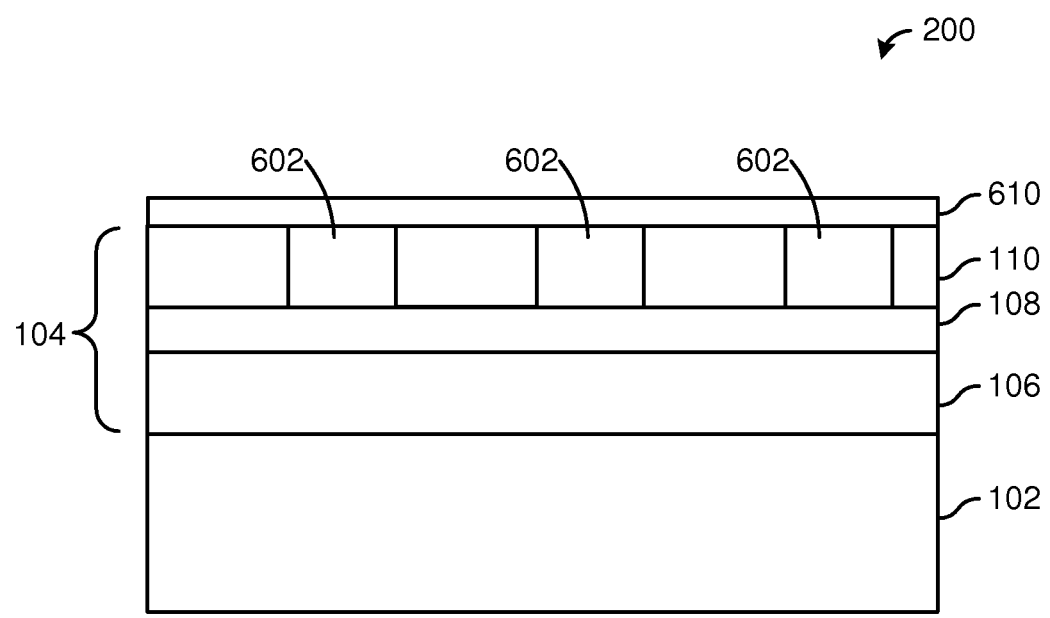

FIGS. 5 and 6 illustrate various process steps for forming a light-emitting diode (LED) device 200 with embedded features in accordance with another embodiment of the present invention. FIGS. 5 and 6 assume a starting structure similar to that described above with reference to FIG. 1, wherein like reference numerals refer to like elements, although other structures may be used. Accordingly, the method of this embodiment is illustrated by the processes discussed above with reference to FIG. 1 followed by the processes described below with reference to FIGS. 5 and 6.

Referring now to FIG. 5, an etching step is performed to create openings 502 in accordance with an embodiment of the present invention. Unlike the etching step performed above with reference to FIG. 2, the etching process in this embodiment is performed such that the openings 502 extend only through the upper LED layer 110. In an embodiment, the etching process is performed at least in part by a PEC wet etch using KOH. Other etching processes, including dry etch processes (e.g., ICP etching, RIE, and the like) and/or wet etch processes (e.g., chemical etching, PAC etching, and the like) may be used. It should be noted that the openings 502 may be of any shape, such as a pyramid, tapered, cylindrical, semisphere, column, rectangular, or the like, but circular openings having a width from about 10 nm to about 10 μm are preferred.

Thereafter, as illustrated in FIG. 6, the openings 502 may be filled with a dielectric material thereby forming embedded elements 602, and planarized if necessary, in a similar manner as described above with reference to FIG. 3.

FIG. 6 also illustrates an optional second upper LED layer 610 formed over the first upper LED layer 110 formed in accordance with an embodiment of the present invention. The optional second upper LED layer 610 may be utilized to help planarize the upper LED layer to allow a better ohmic contact to be formed and may be formed in a manner similar to the optional second upper LED layer 410 discussed above with reference to FIG. 4. Processes may be performed to complete the LED device 200. For example, electrical contacts (front-side and/or back-side contacts) may be formed to the first and second contact layers, respectively, passivation layers may be formed, and the LED device may be diced and packaged.

Figure 7:
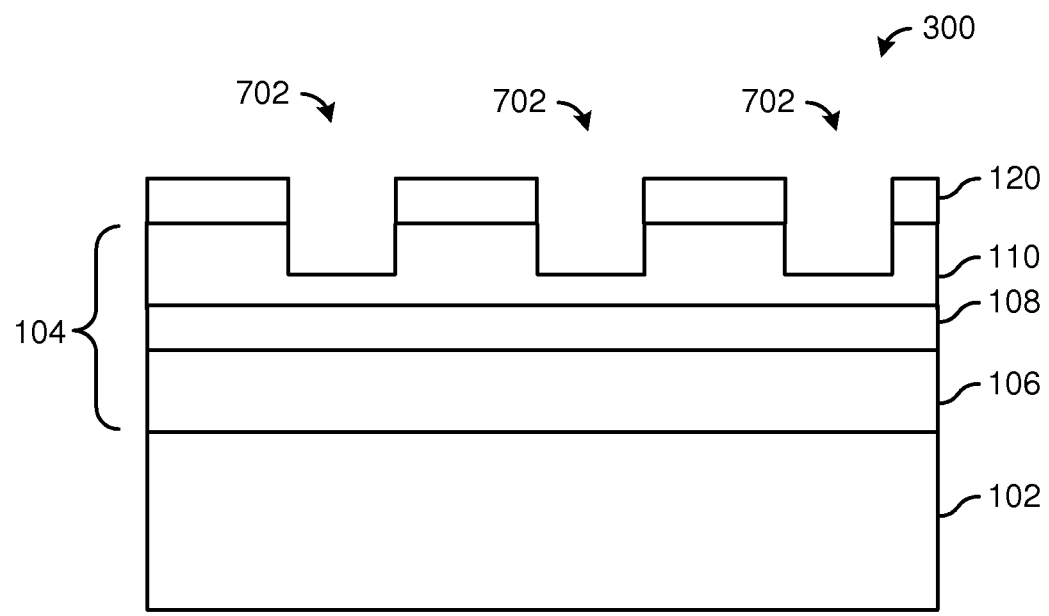
FIGS. 7 and 8 illustrate various process steps for manufacturing a light-emitting diode device in accordance with another embodiment of the present invention.
Figure 8:
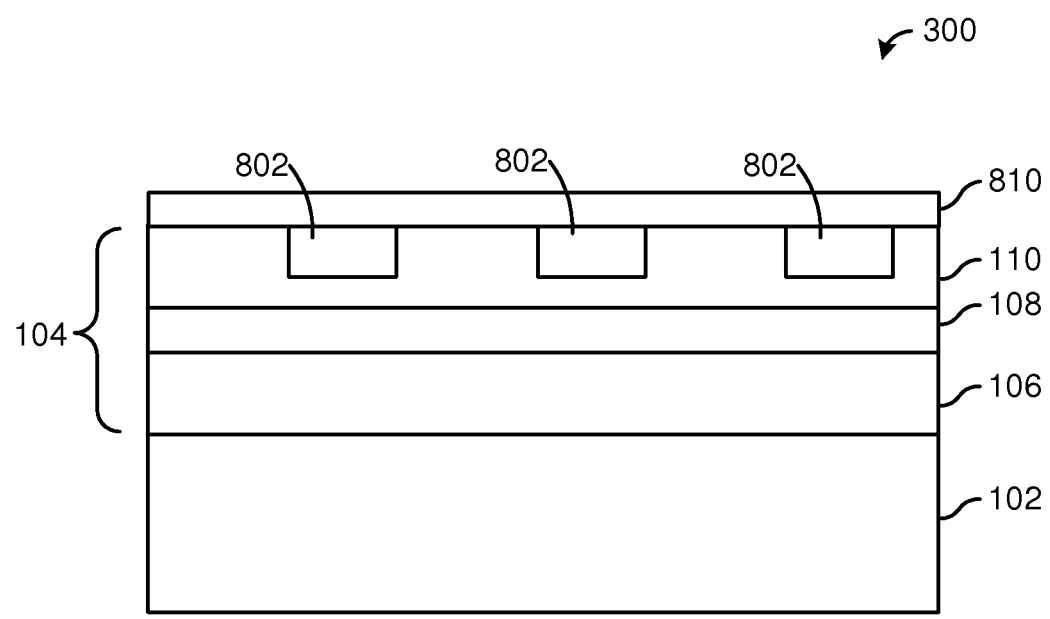

FIGS. 7 and 8 illustrate various process steps for forming a light-emitting diode (LED) device 300 with embedded features in accordance with another embodiment of the present invention. FIGS. 7 and 8 assume a starting structure similar to that described above with reference to FIG. 1, wherein like reference numerals refer to like elements, although other structures may be used.

Referring now to FIG. 7, openings 702 are formed such that the openings are formed only partially through the first upper LED layer 110. In contrast to the embodiments discussed above wherein openings were created that extend completely through the first upper LED layer 110, the openings in this embodiment extend only partially through the first upper LED layer 110. The openings 702 may be formed, for example, by a timed etch using a PEC wet etch using KOH. Other etching processes, including dry etch processes (e.g., ICP etching, RIE, and the like) and/or wet etch processes (e.g., chemical etching, PAC etching, and the like) may be used. It should be noted that the openings 702 may be of any shape, such as a triangular, tapered, cylindrical, semisphere, column, rectangular, or the like, but circular openings having a width from about 10 nm to about 10 μm are preferred.

Thereafter, as illustrated in FIG. 8, the patterned mask 120 (see FIG. 7) may be removed and the openings 702 (see FIG. 7) may be filled with a dielectric material, thereby forming embedded features 802. A planarization process, if necessary, may be performed in a similar manner as described above with reference to FIG. 3.

It should be noted a conductive material may be used to form the embedded features 802 as well. In this embodiment, the embedded features 802 do not contact the light-emitting layer 108, and accordingly a conductive material embedded in the first upper LED layer 110 may be used. For example, the embedded features 802 may comprise indium-tin-oxide (ITO) or ZnO.

FIG. 8 also illustrates an optional second upper LED layer 810 formed over the first upper LED layer 110 formed in accordance with an embodiment of the present invention. The optional second upper LED layer 810 may be utilized to help planarize the upper LED layer to allow a better ohmic contact to be formed and may be formed in a manner similar to the optional second upper LED layer 410 discussed above with reference to FIG. 4. Processes may then be performed to complete the LED device 300. For example, electrical contacts (front-side and/or back-side contacts) may be formed to the first and second contact layers, respectively, passivation layers may be formed, and the LED device may be diced and packaged.

Figure 9:
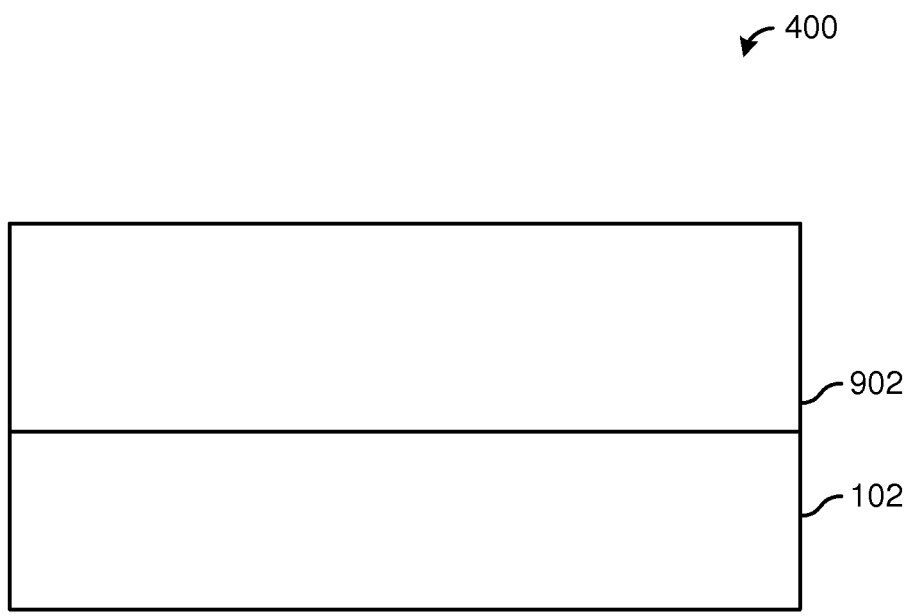
FIGS. 9-11 illustrate various process steps for manufacturing a light-emitting diode device in accordance with another embodiment of the present invention.
Figure 10:
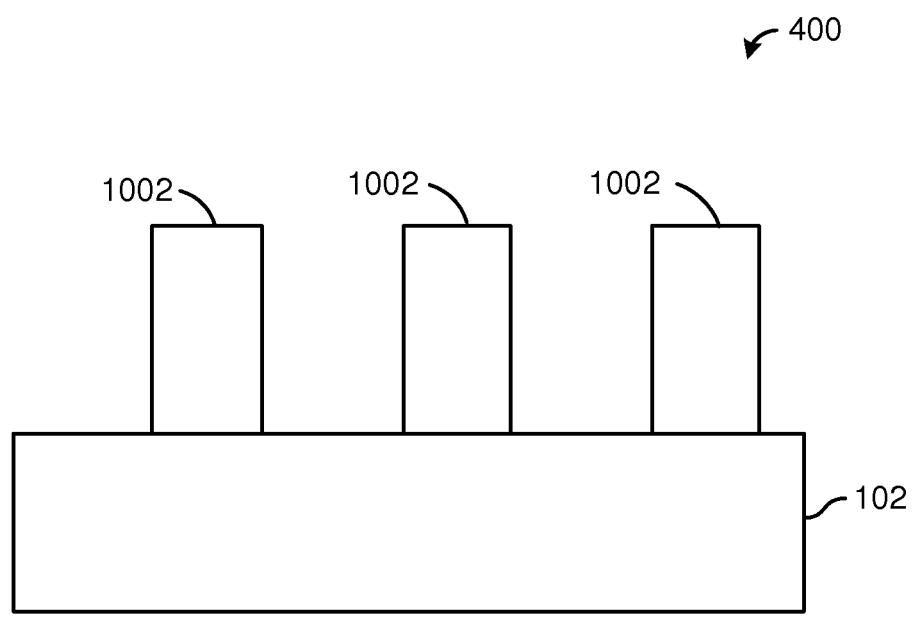
Figure 11:
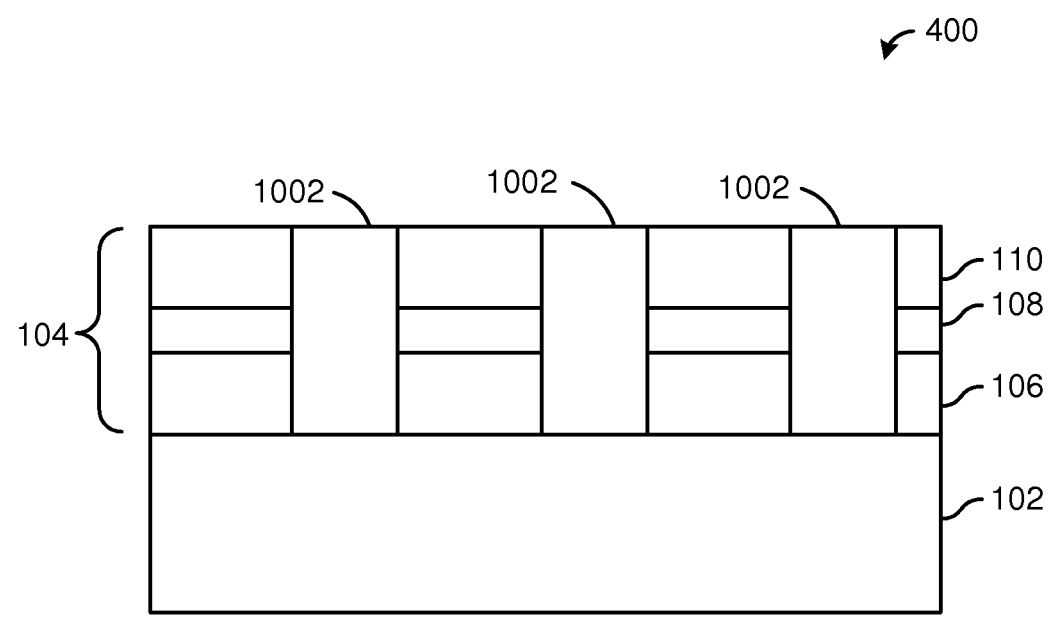

FIGS. 9-11 illustrate various process steps for forming a light-emitting diode (LED) device 400 with embedded features in accordance with another embodiment of the present invention. Referring first to FIG. 9, there is shown a dielectric layer 902 formed over the substrate 102. The dielectric layer 902 may comprise one or more dielectric layers. In an embodiment, a silicon dioxide layer formed by, for example, thermal oxidation or by chemical vapor deposition (CVD) techniques using tetra-ethyl-ortho-silicate (TEOS) and oxygen as precursors. Alternatively, the dielectric layer 902 may be formed of other dielectric materials. For example, silicon nitride, silicon oxynitride, or the like, formed through a process such as CVD may also be used. A multi-layer hard mask, such as layers of silicon dioxide and silicon nitride, may also be used. The dielectric layer 902 preferably has a thickness of about 2 μm to about 6 μm.

As illustrated in FIG. 10, the dielectric layer 902 (see FIG. 9) is subsequently patterned to form embedded elements 1002 in accordance with an embodiment of the present invention. In an embodiment, the dielectric layer 902 is patterned using photolithography techniques known in the art. In this case, the photoresist material is utilized to create the embedded elements 1002. Each of the embedded elements 1002 preferably has a height of about 50 Å to about 1000 Å and a width of about 10 nm to about 10 μm. The embedded elements 1002 may be any shape, such as rectangles, circles, ovals, triangles, and/or the like, but circles are preferred.

Thereafter, as illustrated in FIG. 11, the LED structure 104 is formed. It should be appreciated that the LED structure 104 may be formed using similar materials and similar processes as discussed above with reference to FIG. 1, but due to the processes used and the materials used to form the embedded features, the LED structure 104 will only be formed over the exposed portions of the substrate 102. In this manner, a device similar to that discussed above is formed, but in a different order in that the embedded elements 1002 are formed prior to the LED structure 104 rather than the other way as discussed above with reference to FIGS. 1-4.

Figure 12:
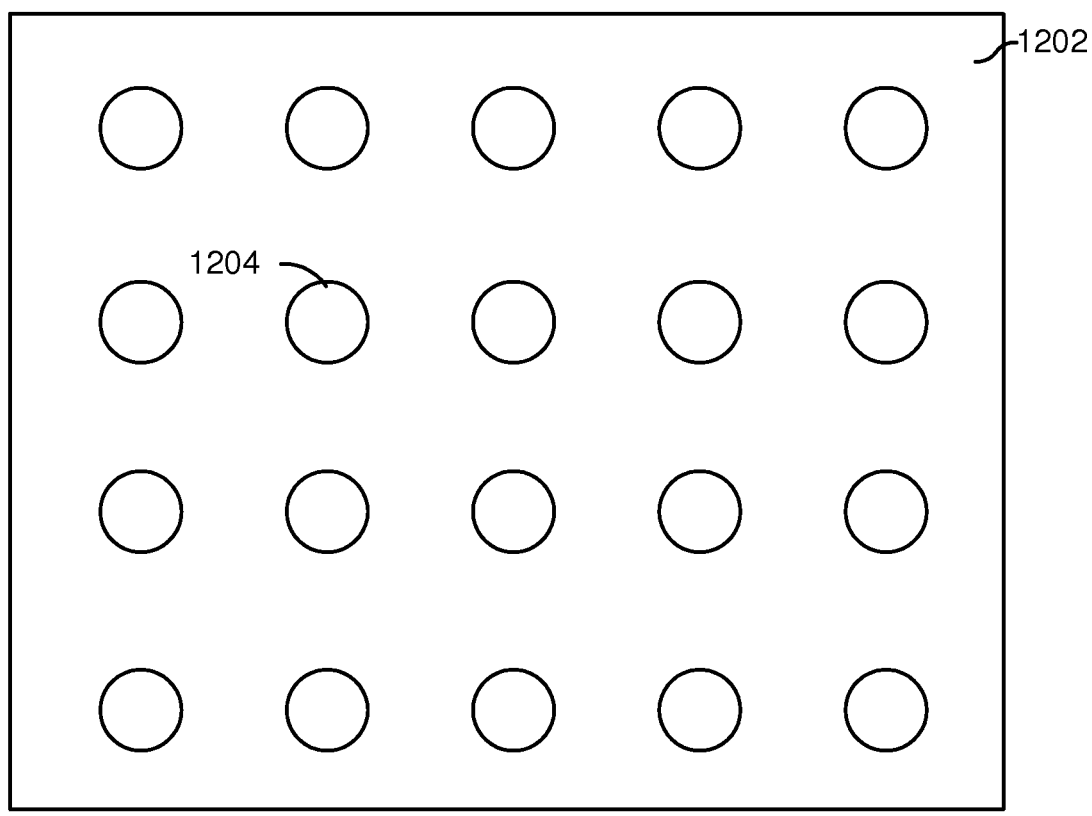
FIGS. 12-14 illustrate plan views of possible arrangements of embedded features in an LED device in accordance with embodiments of the present invention.
Figure 13:
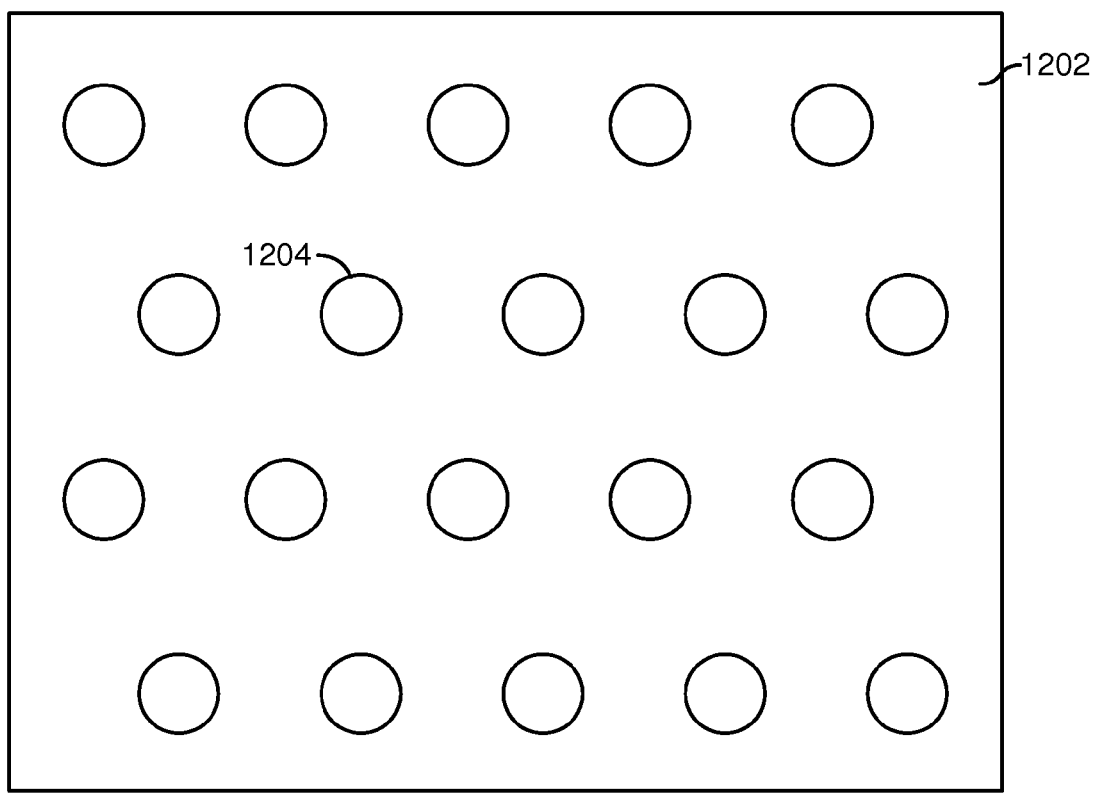
Figure 14:
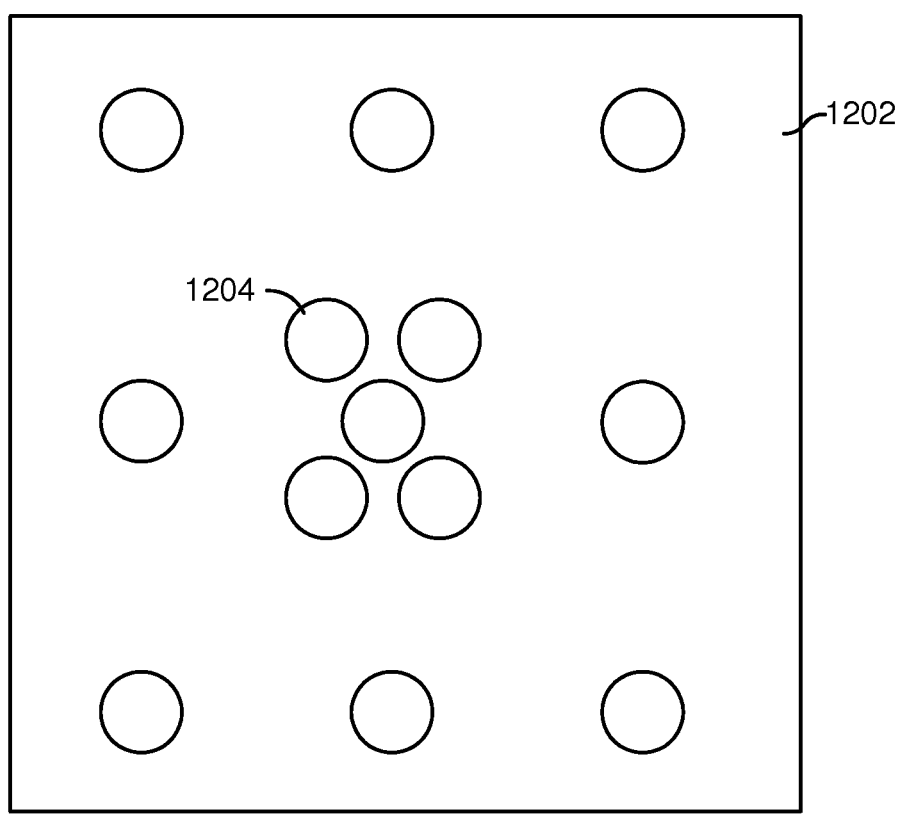

FIGS. 12-14 illustrate various plan views of an LED 1202 having circular embedded features 1204. In particular, FIG. 12 illustrates the LED 1202 having embedded features 1204 arranged in columns and rows, FIG. 13 illustrates the LED 1202 having the embedded features 1204 arranged in a staggered pattern, and FIG. 14 illustrates the LED 1202 having the embedded features 1204 arranged in another pattern. While the shape of the individual embedded features 1204 may be any shape, FIGS. 12-14 illustrate a preferred embodiment in which the embedded features 1204 are circular. In this embodiment the circular embedded features 1204 preferably have a diameter of between about 10 nm and about 10 μm. Other shapes, such as elliptical, rectangular, triangular, or the like, and other patterns may also be used.

It should also be noted that the shapes and patterns may be adjusted to reduce current crowding. In some embodiments, particularly those in which the embedded features are formed of a dielectric material, the embedded features may act as current blocking features, causing the current to flow around the embedded features, possibly causing the temperature of the device to increase and the device to fail. Embodiments such as that illustrated in FIG. 14 may help reduce the current crowding. Furthermore, in embodiments such as that illustrated in FIG. 8, wherein the embedded features do not contact the active layer, a conductive material may be used to form the embedded features. This may further reduce the effect of current crowding.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light-emitting diode (LED) device comprising:
   a substrate;
   an LED structure formed over the substrate, the LED structure having a lower LED layer, an active layer, and a first upper LED layer, wherein the first upper LED layer is a doped semiconductor layer; and
   embedded elements continuously extending at least partially through the first upper LED layer and the active layer of the LED structure, the embedded elements having a refractive index different than the first upper LED layer, wherein the first upper LED layer and the embedded elements have co-planar upper surfaces that are facing the same direction.

2. The LED device of claim 1, further comprising a second upper LED layer over the first upper LED layer.

3. The LED device of claim 1, wherein the embedded elements extend through the lower LED layer.

4. The LED device of claim 1, wherein at least a portion of the first upper LED layer is between the embedded elements and the active layer.

5. The LED device of claim 4, wherein the embedded elements comprise a conductive material.

6. A light-emitting diode (LED) device comprising:
   a substrate;
   an LED structure over the substrate, the LED structure having a first conductive layer, an active layer, and a second conductive layer, wherein the first and second conductive layers include semiconductor materials doped with different types of conductivity;

embedded elements that each continuously extend at least partially through the first conductive layer and the active layer, the embedded elements having a refractive index different than a layer of the LED structure in which the embedded elements are embedded, wherein an uppermost surface of the embedded elements is co-planar with an upper surface of the first conductive layer; and a third conductive layer located on the uppermost surface of the embedded elements and on the upper surface of the first conductive layer.

7. The LED device of claim 6, wherein the embedded elements completely extend through the active layer of the LED structure.

8. The LED device of claim 6, wherein the embedded elements extend only partially through the first conductive layer.

9. The LED device of claim 6, wherein the LED structure comprises a conductive layer extending over the embedded elements.

10. The LED device of claim 6, wherein the embedded elements are separated from the active layer of the LED structure.

11. The LED device of claim 6, wherein the embedded elements comprise a conductive material.

12. A light-emitting diode (LED) device comprising:

a light emitting structure comprising multiple layers;

one or more refractive elements each continuously extending at least partially through at least two layers of the light emitting structure, the refractive elements having a refractive index different than layer of the light emitting structure in which the refractive elements are embedded, wherein the one or more refractive elements have flat top surfaces that are co-planar with a flat top surface of the light emitting structure, wherein a layer of the light emitting structure having the flat top surface is a doped semiconductor layer; and a group III-V compound layer disposed on the flat co-planar top surfaces of the one or more refractive elements and the light emitting structure.

13. The LED device of claim 12, wherein the refractive elements extend through an active layer of the light emitting structure.

14. The LED device of claim 12, wherein the embedded elements extend only partially through an upper conductive layer of the light emitting structure.

15. The LED device of claim 12, wherein the light emitting structure comprises a conductive layer extending over the refractive elements.

16. The LED device of claim 12, wherein the refractive elements are separated from an active layer of the light emitting structure.

17. The LED device of claim 12, wherein the refractive elements comprise a conductive material.

18. The LED device of claim 12, wherein the light emitting structure comprises a lower conductive layer, an active layer, and an upper conductive layer.

19. The LED device of claim 2, wherein the second upper LED layer is located over the co-planar surfaces of the first upper LED layer and the embedded elements.

20. The LED device of claim 1, wherein the embedded elements include a dielectric material.

\* \* \* \* \*